(12) United States Patent
Morhart et al.

(10) Patent No.: US 10,136,398 B2
(45) Date of Patent: Nov. 20, 2018

(54) COMMUNICATION APPARATUS WITH ANTENNA ATTENUATION COMPENSATION

(71) Applicant: Continental Automotive GmbH, Hannover (DE)

(72) Inventors: Christian Morhart, Koefering (DE); Richard Owen, Regensburg (DE)

(73) Assignee: CONTINENTAL AUTOMOTIVE GMBH, Hannover (DE)

( * ) Notice: Subject to any disclaimer, the term of this patent is extended or adjusted under 35 U.S.C. 154(b) by 0 days.

(21) Appl. No.: 15/756,632

(22) PCT Filed: Aug. 29, 2016

(86) PCT No.: PCT/EP2016/070279
§ 371 (c)(1),
(2) Date: Mar. 1, 2018

(87) PCT Pub. No.: WO2017/045900
PCT Pub. Date: Mar. 23, 2017

(65) Prior Publication Data
US 2018/0270768 A1 Sep. 20, 2018

(30) Foreign Application Priority Data
Sep. 16, 2015 (DE) .......... 10 2015 217 695

(51) Int. Cl.
*H04B 7/00* (2006.01)
*H04W 52/36* (2009.01)
(Continued)

(52) U.S. Cl.
CPC ........ *H04W 52/367* (2013.01); *H04B 1/3822* (2013.01); *H04B 1/40* (2013.01); *H04B 2001/0416* (2013.01)

(58) Field of Classification Search
CPC ..... H04W 52/367; H04B 1/3822; H04B 1/40; H04B 2001/0416
See application file for complete search history.

(56) References Cited

U.S. PATENT DOCUMENTS

| 5,048,117 A | 9/1991 | Aisaka et al. ................. 455/571 |
| 5,548,820 A * | 8/1996 | Victorin ................ H04W 24/00 343/703 |

(Continued)

FOREIGN PATENT DOCUMENTS

| DE | 102014215578 A1 | 2/1916 | ............... H04B 1/40 |
| WO | 2017/045900 A1 | 3/1917 | ............... H04B 1/40 |

OTHER PUBLICATIONS

German Office Action, Application No. 102015217695.9, 10 pages, dated Apr. 11, 2016.

(Continued)

*Primary Examiner* — Dominic Rego
(74) *Attorney, Agent, or Firm* — Slayden Grubert Beard PLLC

(57) ABSTRACT

The present disclosure relates to communication systems for a motor vehicle. In some embodiments, a communication device may provide, for example, car-to-car communication (vehicle-to-vehicle communication). A communication system for a motor vehicle, the system may include: a transceiver unit for generating transmission signals where at least two of the transmission signals differ in their signal power; a cable to transmit the transmission signals to an antenna via a controllable amplifier device; a power detector device capturing a respective power value correlated with a power of the transmission signals at a tapping point between the cable and the antenna; and a control device controlling the amplifier device on the basis of the captured power values. The transceiver device generates at least one of the transmission signals with a predetermined reference power. A (Continued)

reference value describing the reference power is permanently predefined in the control device. The control device selects one of the power values as an actual value of the power of the transmission signal generated with the reference power at the tapping point and sets a transmission gain value of the amplifier device on the basis of a discrepancy between the reference value and the actual value.

11 Claims, 1 Drawing Sheet

(51) Int. Cl.
*H04B 1/3822* (2015.01)
*H04B 1/40* (2015.01)
*H04B 1/04* (2006.01)

(56) References Cited

U.S. PATENT DOCUMENTS

| | | | | |
|---|---|---|---|---|
| 5,551,057 A * | 8/1996 | Mitra | ............... | H04W 52/24 370/328 |
| 6,356,745 B1 * | 3/2002 | Lee | ............... | H04W 52/367 330/129 |
| 6,594,508 B1 * | 7/2003 | Ketonen | ............... | G01R 29/10 455/422.1 |
| 9,491,713 B2 | 11/2016 | Dykyy et al. | | |
| 2003/0013427 A1 * | 1/2003 | Ishihara | ............... | H03G 3/3042 455/232.1 |
| 2006/0132058 A1 * | 6/2006 | Choi | ............... | H04W 52/367 315/210 |
| 2007/0032208 A1 * | 2/2007 | Choi | ............... | H03F 1/3223 455/114.3 |
| 2009/0140842 A1 * | 6/2009 | Suzuki | ............... | G06K 7/0008 340/10.51 |
| 2011/0032073 A1 * | 2/2011 | Mullet | ............... | G07C 9/00182 340/5.7 |
| 2011/0094454 A1 * | 4/2011 | Won | ............... | A01K 15/021 119/720 |
| 2011/0096687 A1 * | 4/2011 | Dottling | ............... | H04W 24/02 370/252 |
| 2012/0157020 A1 * | 6/2012 | Sasaki | ............... | H03F 1/0233 455/127.1 |
| 2014/0148214 A1 | 5/2014 | Sasson | ............... | 455/522 |
| 2015/0011157 A1 | 1/2015 | Terry | ............... | 455/10 |

OTHER PUBLICATIONS

International Search Report and Written Opinion, Application No. PCT/EP2016/070279, 21 pages, dated Dec. 6, 2016.

* cited by examiner

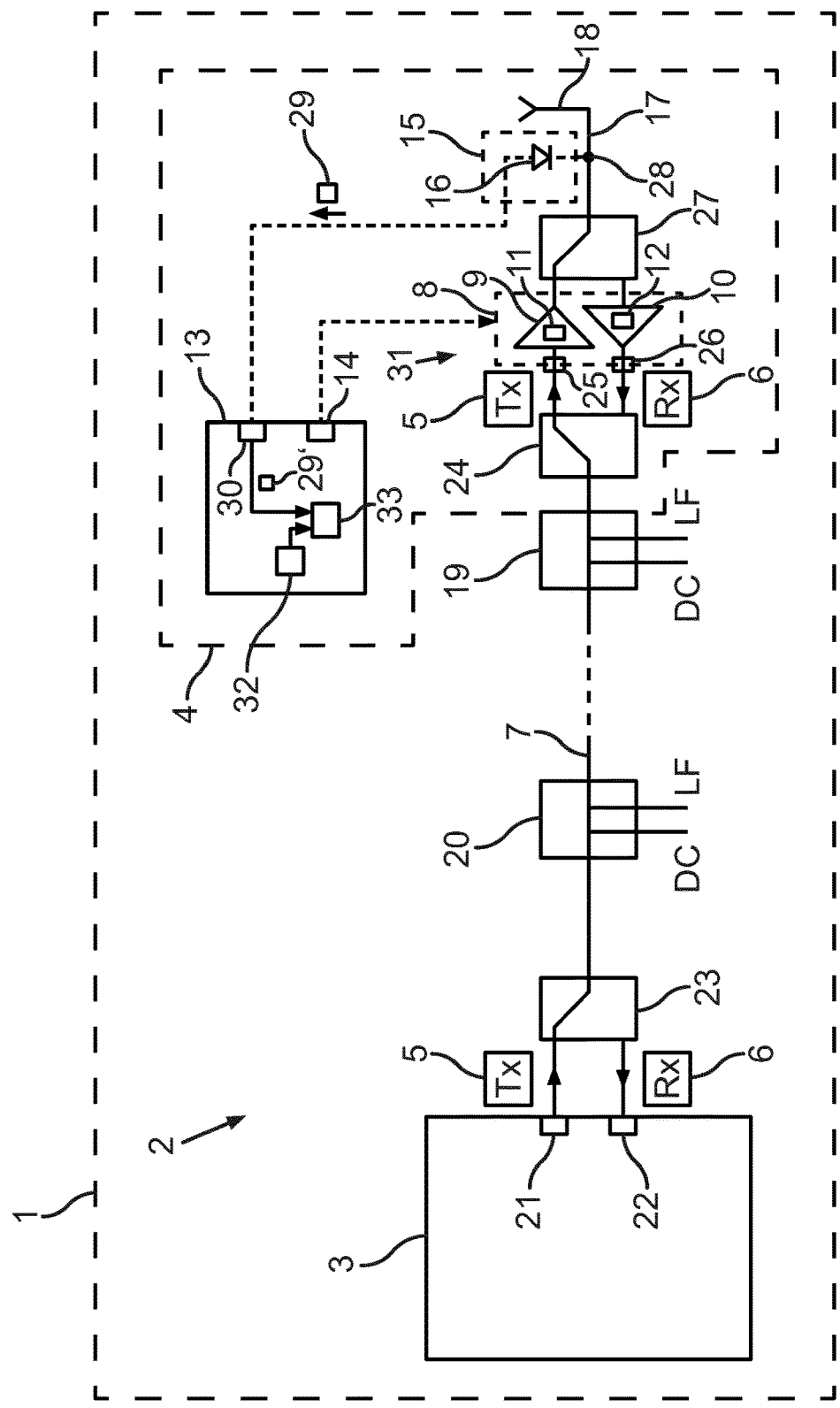

COMMUNICATION APPARATUS WITH ANTENNA ATTENUATION COMPENSATION

CROSS-REFERENCE TO RELATED APPLICATIONS

This application is a U.S. National Stage Application of International Application No. PCT/EP2016/070279 filed Aug. 29, 2016, which designates the United States of America, and claims priority to DE Application No. 10 2015 217 695.9 filed Sep. 16, 2015, the contents of which are hereby incorporated by reference in their entirety.

TECHNICAL FIELD

The present disclosure relates to communication systems for a motor vehicle. In some embodiments, a communication device may provide, for example, car-to-car communication (vehicle-to-vehicle communication).

BACKGROUND

When designing a communication apparatus for a motor vehicle, the problem often arises of the transceiver unit and the antenna having to be arranged at different installation locations. Therefore, a relatively long cable is needed to communicate the transmission signals from the transceiver unit to the antenna. The signal attenuation of the cable is therefore noticeable when emitting the transmission signals. Some communication standards provide a prescribed transmission power for the transmission signals to be emitted. The actual power with which a transmission signal is emitted by the antenna may be unknown even though it has been generated with a known signal power at a transmission output of the transceiver unit because it has been attenuated by the cable.

An amplifier device can amplify the transmission signal again at the antenna end of the cable in order to compensate for the cable attenuation. In such systems, it is necessary to know the transmission gain value by which the transmission signal must be amplified by the amplifier device. One possibility for determining the transmission gain value involves measuring the power of the transmission signals once at the transceiver end of the cable and once at the antenna end of the cable. The transceiver measuring circuit, however, must be wired to the control device for the amplifier device. This results in a large amount of wiring and connection complexity when providing the communication apparatus.

SUMMARY

The teachings of the present disclosure may be employed to implement attenuation compensation for the antenna cable with little circuit complexity in a communication device. For example, some embodiments may include a communication apparatus (2) for a motor vehicle (1), having: a transceiver unit (3) for generating transmission signals (5) at a transmission output (21) of the transceiver unit (3), wherein at least two of the transmission signals (5) differ in terms of their signal power; a cable (7) which is coupled to the transmission output (21) and is intended to transmit the transmission signals (5) to an antenna (18), wherein the antenna (18) is connected to an antenna end (19) of the cable (7) via a controllable amplifier device (8) for amplifying the transmission signals (5) transmitted via the cable (7); a power detector device (15) for capturing a respective power value (29) correlated with a power of the transmission signals (5) at a tapping point (28), wherein the tapping point (28) is arranged between the antenna end (19) of the cable (7) and the antenna (18); and a control device (13) for controlling the amplifier device (8) on the basis of the captured power values.

In some embodiments, the transceiver device (3) is set up to generate at least one of the transmission signals (5) with a predetermined reference power, wherein a reference value (32) describing the reference power is permanently predefined in the control device (13), and the control device (13) is set up to select one of the power values (29) as an actual value (29') which indicates the power of the at least one transmission signal (5) generated with the reference power at the tapping point (28) and to set a transmission gain value (11) of the amplifier device (8) on the basis of a discrepancy (33) between the reference value (32) and the actual value (29').

In some embodiments, the transceiver device (3) is set up to generate the transmission signals (5) at the transmission output (21) each solely with a transmission power selected from one of at least two predefined power levels, the reference power corresponds to one of the power levels, and the control device (13) is set up to select, as the actual value (29'), that power value (29) which indicates a power between the power level of the reference power and the next lower power level.

In some embodiments, the transceiver device (3) is set up to generate, as a transmission signal (5), a calibration signal with the reference power on the basis of a trigger signal, and the control device (13) is set up to select the actual value (29') on the basis of the trigger signal.

In some embodiments, the reference power corresponds to a maximum or a minimum transmission power, and the control device (13) is set up to select a maximum value or a minimum value of the power values (29) as the actual value (29').

In some embodiments, the amplifier device (8) is set up to amplify reception signals (6) received via the antenna (18) on the basis of a reception gain value (12) and to then forward them to the cable (7), and the control device (13) is set up to set the reception gain value (12) on the basis of the discrepancy (33).

In some embodiments, the amplifier device (8) is connected to the cable (7) via a multiplexer (24), and the transceiver device (3) is designed to change over the multiplexer (27) between a transmission position and a reception position by means of a switching signal (LF), wherein the control device (13) is set up to distinguish between power values (29) of the transmission signals (5) and power values (29) of the reception signals (6) on the basis of the switching signal (LF) and to take into account only power values (29) of the transmission signals (5) for the purpose of determining the discrepancy (33).

In some embodiments, the control device (13) takes into account only power values (29) captured between the antenna end (19) of the cable (7) and the antenna (18) for the purpose of determining the discrepancy (33).

In some embodiments, the control device (13) is electrically coupled to the transceiver device (3) solely via the cable (7).

In some embodiments, the power detector device (15) is in the form of a diode-based envelope demodulator (16).

In some embodiments, the communication device (2) is set up to generate the transmission signals (5) according to a car-to-car communication protocol.

Some embodiments may include a motor vehicle (1) having a communication apparatus (2) as described above.

Some embodiments may include a method for compensating (31) for cable attenuation in a communication apparatus (2) comprising: a transceiver unit (3) generates transmission signals (5) at a transmission output (21) of the transceiver unit (3), wherein at least two of the transmission signals (5) differ in terms of their signal power; a cable (7) which is coupled to the transmission output (21) transmits the transmission signals (5) to an antenna (18), wherein a controllable amplifier device (8) for amplifying the transmission signals (5) transmitted via the cable (7) is connected between an antenna end (19) of the cable (7) and the antenna (18); a power detector device (15) captures respective power values (29) correlated with a power of the transmission signals (5) at a tapping point (28) which is arranged between the antenna end (19) of the cable (7) and the antenna (18); and a control device (13) controls the amplifier device (8) on the basis of the captured power values (29).

In some embodiments, the transceiver device (3) generates at least one of the transmission signals (5) with a predetermined reference power, wherein a reference value (32) describing the reference power is permanently predefined in the control device (13), and the control device (13) selects, from the power values (29), an actual value (29') which indicates the power of the at least one transmission signal (5) generated with the reference power at the tapping point (28) and sets a transmission gain value (11) of the amplifier device (8) on the basis of a discrepancy (33) between the reference value (32) and the actual value (29').

BRIEF DESCRIPTION OF THE DRAWINGS

An exemplary embodiment is described below. In this respect, the single FIGURE (FIGURE) shows a schematic illustration of one embodiment of a motor vehicle according to the teachings of the present disclosure.

DETAILED DESCRIPTION

The teachings of the present disclosure describe communication devices for motor vehicles, as can be provided for car-to-car communication, for example. In the manner described, a transceiver unit for generating transmission signals at a transmission output of the transceiver unit is provided. Each transmission signal corresponds to a data packet or a message. The transmission signals are generated in temporal succession. They are, in particular, transmission signals which are generated at the same carrier frequency. At least two of the transmission signals differ in terms of their signal power. The reason for this may be that a changeover is made between different power levels when generating the transmission signals. This is provided in the communication protocol for car-to-car communication, for example. For example, the different transmission powers can be predefined according to the IEEE 802.11a or IEEE 802.11h standard (TPC—Transmitter Power Control). The communication apparatus also has a cable which is coupled to the transmission output and is intended to transmit the transmission signals to an antenna. The cable may be, for example, a coaxial cable. In this case, the antenna is connected to an antenna end of the cable via a controllable amplifier device (VGA—Variable Gain Amplifier) for amplifying the transmission signals transmitted via the cable.

The aim is now to set a transmission gain value of the amplifier device in such a manner that the cable attenuation is compensated for in the transmission signals. A power detector device for capturing a respective power value of the transmission signals is provided for this purpose. The power values are correlated with a power of the transmission signals, which the transmission signals have at the tapping point. This tapping point is arranged between the antenna end of the cable and the antenna. Each power value therefore indicates the power of the transmission signals which results after transmission via the cable. Depending on whether the tapping point of the power detector device is connected upstream or downstream of the amplifier device, the influence of the amplifier device is also expressed by the power value. A control device is provided to control the amplifier device on the basis of the captured power values.

Since the transceiver unit generates at least two of the transmission signals with a different signal power, the extent to which the power values differ from the desired signal power presented by the respective transmission signal at the signal output cannot be observed from the power values themselves, however. This is initially not known at the antenna.

To decide on the basis of the power values captured at the tapping point which value the transmission gain value of the amplifier device is intended to have, the transceiver unit is set up to generate at least one of the transmission signals with a predetermined reference power. A reference value which describes the reference power is also permanently predefined in the control device. It can be stored as a digital value, for example, or can be defined by a reference voltage, for example, in an analog comparison circuit. The control device is also set up to identify or select an actual value from the power values. This actual value indicates the power of the at least one transmission signal generated with the reference power at the tapping point.

In other words, the control device selects, from the power values, that value from which it is clear, on account of the transmission situation, that it must be a power value belonging to a signal which has been generated with the reference power at the signal output of the transceiver device. This power value is then treated as the actual value. The control device sets the transmission gain value of the amplifier device on the basis of a discrepancy between the reference value and the actual value. In particular, the transmission gain value is set in such a manner that the discrepancy between the reference value and the actual value is reduced. In other words, the power at the tapping point is amplified and is preferably set to the reference power again for signals which have the reference power at the transmission output. The discrepancy can be calculated as a difference or quotient, for example. In the case of an analog comparison circuit, the discrepancy can be determined by means of an operational amplifier, for example.

The control device can set the transmission gain value for the antenna amplifier device solely on the basis of power values from a power detector device which is likewise provided at the antenna end of the cable. In other words, there is no need for any additional wiring of the control device to the transceiver end of the cable to capture power values there. This saved or dispensable wiring and the second sensor which is not required reduce the connection complexity when providing the communication device.

In some embodiments, the transceiver device is set up to generate the transmission signals at the transmission output each solely with a transmission power selected from one of at least two predefined power levels. In other words, the transmission power is discretized. The transmission power is therefore changed only by predetermined step values. Naturally, said reference power may correspond to one of the power levels. The control device is set up to select, as the actual value, that power value which indicates a power between the power level of the reference power and the next lower power level. The step size or step height of the power levels is preferably selected in this case in such a manner that it is greater than any possible or expected cable attenuation. The development results in the advantage of the transmission gain value being able to be determined during ongoing operation of the communication apparatus without interrupting communication.

In some embodiments, the transceiver device generates, as a transmission signal, a calibration signal with the reference power on the basis of a trigger signal. The control device is set up to select the actual value on the basis of the trigger signal. In other words, the trigger signal triggers a calibration phase of the communication apparatus. The time at which the transmission signal is generated with the reference power, that is to say the calibration signal, is known. Therefore, there is no need to wait until the transceiver device generates a transmission signal with the reference power as part of communication. For example, the trigger signal may involve the communication apparatus being activated, that is to say changing from a deenergized to an energized state.

In some embodiments, the reference power corresponds to a maximum or a minimum transmission power. For example, the reference power may correspond to the highest or lowest power level in the case of the stepped power described. If the reference power corresponds to the maximum transmission power, the transmission device is set up to select a maximum value of the captured power values as the actual value. If the reference power corresponds to the minimum transmission power, the transmission device is accordingly set up to select a minimum value of the captured power values as the actual value. In other words, a histogram analysis of the captured power values is carried out and the maximum value or the minimum value is selected as the actual value. This results in the advantage that the transceiver device can also use a stepped signal power, the power levels of which are lower than the possible or expected attenuation values of the cable.

In some embodiments, the system compensates for the cable attenuation even during signal reception. In this development, the amplifier device is set up to amplify reception signals received via the antenna on the basis of a reception gain value and to then forward the amplified reception signals to the cable. The amplified reception signals then pass to the transceiver device via the cable. The control device may set the reception gain value on the basis of said discrepancy between the reference value and the actual value. There is no need to determine any additional cable attenuation with respect to the reception signals.

To interchange both transmission signals and reception signals between the antenna end of the cable and the amplifier device, the amplifier device may be connected to the cable via a multiplexer. Such a multiplexer may include a separating filter circuit which alternately connects an amplifier input of the amplifier device to the antenna end of the cable and connects an amplifier output of the amplifier device to the antenna end of the cable. The transceiver device may connect the multiplexer between a transmission position (cable is coupled to the amplifier input) and a reception position (cable is coupled to the amplifier output of the amplifier device) by means of a switching signal. The switching signal may be transmitted, for example, via the cable itself as a signal which has a lower frequency than the transmission signals.

The control device may distinguish, on the basis of the switching signal, between power values of the transmission signals and power values of the reception signals which can both be captured by the power detection device since the latter itself does not distinguish between transmission signals and reception signals. The control device may take into account only power values of the transmission signals for the purpose of determining said discrepancy. This results in the advantage that the transmission gain value and the reception gain value are not corrupted by the power of the reception signals.

In the described manner, the control device may take into account only power values captured between the antenna end of the cable and the antenna for the purpose of determining the discrepancy. The control device therefore need not be coupled to a power detector at the transmission output of the transceiver via an additional measuring circuit.

In some embodiments, the control device may be electrically coupled to the transceiver device solely via the cable itself. The only connection which is therefore necessary between the transceiver device and the antenna arrangement (antenna, amplifier device and control device) is therefore the cable itself. This minimizes the connection complexity. Nevertheless, the antenna arrangement may calibrate or parameterize itself to the effect that the attenuation of the cable is compensated for. The antenna arrangement is therefore self-calibrating or self-parameterizing.

To generate said power values at the tapping point, some embodiments include a power detector device in the form of a diode-based envelope demodulator. As a result, the power detector device can be implemented with particularly little circuit complexity.

In some embodiments, the communication device is set up to generate the transmission signals according to the car-to-car communication protocol. In other words, the communication apparatus is configured according to the IEEE 802.11 standard. It is therefore a WiFi communication apparatus.

In some embodiments, the system includes a motor vehicle. The motor vehicle may have the transceiver unit and the antenna arranged at different installation locations and can be connected using a cable. The signal attenuation caused by the cable is then compensated for by the communication apparatus in a self-calibration or self-parameterization process without additional measuring lines having to be provided for this purpose between the transceiver device and the antenna end of the cable.

Some embodiments may include a method for compensating for cable attenuation in a communication apparatus. In the method, a transceiver unit generates transmission signals at a transmission output of the transceiver unit, wherein at least two of the transmission signals differ in terms of their signal power, as may be caused, for example, by the described TPC (Transceiver Power Control). A cable which is coupled to the transmission output transmits the transmission signals from the transmission output to an antenna. In this case, a controllable amplifier device for amplifying the transmission signals transmitted via the cable is connected between an antenna end of the cable and the antenna. Furthermore, a power detector device captures respective power values correlated with the power of the transmission signals at a tapping point which is arranged between the antenna end of the cable and the antenna.

A control device controls the amplifier device on the basis of the captured power values. To read the cable attenuation from the power values and accordingly to set the transmission gain value in the amplifier device for the purpose of compensating for the cable attenuation, the transceiver device may generate at least one of the transmission signals with a predetermined reference power and for a reference value describing the reference power to be permanently predefined in the control device. The control device selects, from the power values from the power detector device, an actual value which indicates the power of the at least one transmission signal generated with the reference power at the tapping point. The transmission gain value of the amplifier device is set by the control device on the basis of a discrepancy between the reference value and the actual value. In some embodiments, there is no need for a power measurement at the transceiver end of the cable in order to determine the cable attenuation and therefore the transmission gain value.

In the exemplary embodiment of the FIGURE, the described components of the embodiment each represent individual features which are to be considered independently of one another and which may function independently of one another and can therefore also be considered either individually or in a combination other than that shown. Furthermore, further features which have already been described can also be added to the described embodiment.

The FIGURE shows a motor vehicle 1 which may be, for example, an automobile, e.g., a truck or a passenger vehicle. The motor vehicle 1 has a communication apparatus 2 for vehicle-to-vehicle communication or car-to-car communication or C2C communication. The communication apparatus 2 may have a transceiver unit 3 and an antenna arrangement 4. A cable 7 for electrically connecting the transceiver unit 3 and the antenna arrangement 4 transmits transmission signals 5 and reception signals 6 between the transceiver unit 3 and the antenna arrangement 4. The cable 7 may be a coaxial cable, for example. The cable 7 may be, for example, longer than 50 centimeters, in particular longer than 1 meter.

When transmitting the transmission signals 5 and the reception signals 6, the cable 7 attenuates the signals, e.g., a power or amplitude of the transmission signals 5 and of the reception signals 6 is reduced during transmission via the cable 7. To compensate for the cable attenuation of the cable 7, the antenna arrangement 4 has an amplifier device 8. The amplifier device 8 may have a transmission amplifier 9 and a reception amplifier 10. The transmission signals 5 can be amplified by means of the transmission amplifier 9 on the basis of a transmission gain value 11. The reception signals 6 can be amplified by means of the reception amplifier 10 on the basis of a reception gain value 12.

The transmission gain value 11 and the reception gain value 12 can be set by a control device 13 of the antenna arrangement 4. For this purpose, a control output 14 of the control device 13 is coupled to the amplifier device 8. The control device 13 may be implemented, for example, on the basis of a microcontroller. The control device 13 may also be implemented as an integrated circuit or as a discrete circuit.

A power detector device 15 is provided in the antenna arrangement 4 for the purpose of determining or capturing the power of the transmission signals 5. The power detector device 15 may include a diode 16 for envelope demodulation. In the example illustrated in the FIGURE, the power detector device 15 is connected to an antenna line 17 which couples an antenna 18 of the antenna arrangement 4 to the amplifier device 8. The antenna 18 transmits the transmission signals 5 into the air and receives the reception signals 6 from the air.

The cable 7 can be connected to the antenna arrangement 4 via a coupler 19. The coupler 19 constitutes an antenna end of the cable 7. The cable 7 can be coupled to the transceiver device 3 via a further coupler 20. The coupler 20 constitutes a transceiver end of the cable 7. By means of the couplers 19, 20, provision may be made for a supply voltage or DC voltage DC and a control signal LF, which has a lower frequency than the transmission signals 5 and the reception signals, to also be transmitted via the cable 7 in addition to the transmission signals 5 and the reception signals 6.

The transceiver device 3 generates the transmission signals 5 at a transmission output 21 and receives the reception signals 6 at a reception input 22. To alternately couple the transducer 20 to the transmission output 21 for emitting the transmission signals 5 and to the reception input 22 for receiving the reception signals 6, a controllable switch or a controllable separating filter or a controllable multiplexer 23 is connected between the transducer 20, on the one hand, and the transmission output 21 and the reception input 22, on the other hand. The multiplexer 23 is controlled by the transceiver device 3, for example. The transducer 19 is also connected to an amplifier input 25 of the transmission amplifier 9 and to an amplifier output 26 of the reception amplifier 10 via a controllable multiplexer 24. The transmission amplifier 9 and the reception amplifier 10, on the one hand, and the antenna line 17, on the other hand, are connected via a further controllable multiplexer 27.

A tapping point 28 of the power detector device 17 for capturing the power of the reception signals 5 in the antenna arrangement 4 may be arranged between the multiplexer 27 and the antenna 18. In other words, the tapping point 28 is situated on the antenna line 17. The multiplexers 24 and 27 may also be connected or controlled by the transceiver device 3. For the purpose of switching, the communication signal LF may comprise or contain, for example, a switching signal for switching the multiplexers 24 and 27.

The antenna arrangement 4 need only be coupled to the transceiver device 3 via the cable 7. There is no need for any additional measuring lines. Only one power detector device 15 is also needed to set the transmission gain value 11 and the reception gain value 12 by means of the control device 13. For this purpose, the control device 13 receives power values 29 from the power detector device 15 at a signal input 30. The power values 29 may be amplitude values of an analog signal, for example. The control device 13 generates the transmission gain value 11 and the reception gain value 12 on the basis of the power values 29. The transmission gain value 11 and the reception gain value 14 may be identical, for example.

The gain is therefore controlled by means of the power detector device 15, the control device 13 and the amplifier device 8 exclusively inside the antenna arrangement 4, that is to say exclusively at the antenna end of the cable 7. For this purpose, the control device 13 captures power values 29 of the transmission signals 5, that is to say the strength of the emitted data packets. The power values 29 are therefore captured only on that side of the cable 7 on which attenuation compensation 31 for the cable attenuation of the cable 7 is also carried out by the amplifier device 8.

The control device 13 compares the power values 29 with a reference value 32. The reference value 32 represents a desired power or reference power which indicates, for example, that transmission power which some particular transmission signals 5 are intended to have at the tapping point 28. The power is controlled in the variable amplifier (VGA) in the form of the transmission amplifier 9 via the discrepancy, for example the difference. In other words, the transmission gain value 11 is set on the basis of the discrepancy 33.

To estimate the cable attenuation without a power detector on the transceiver side, the power to be transmitted must be known at the tapping point 28. The same applies to the time of the transmission signals 5. Otherwise, a power value 29 of a reception signal 6 would be used as a basis. The first point (known power) can be achieved using the following technical solutions:

A first solution provides for the transmission power of the transmission signals 5 at the transmission output 21 to have discretization which is greater than possible values for the cable attenuation. For example, it is possible to provide two transmission powers or power levels, for example +23 dBm and +10 dBm. This rough discretization makes it possible, in the case of variations in the cable attenuation of up to 10 to 12 dB, to determine the transmission power of the transmission signal 5 at the transmission output 21 on the basis of the power values 29 at the tapping point 28. For example, the value +23 dBm can therefore be stored as the reference value 32. If a power value 29 which is greater than +10 dBm but is less than the reference value 32 is then received, this power value 29 is an actual value 29' of the power of the transmission signal 5 generated with the reference power, that is to say +23 dBm in the example, at the transmission output 21.

A second solution may provide a calibration phase. It is possible, for example when starting the communication apparatus 2 if it is coupled to a supply voltage, or at predefined times, to emit calibration pulses, that is to say to generate, as a transmission signal 5, a calibration signal which has a defined transmission power, for example the stated +23 dBm. The control device 13 identifies the calibration phase or the calibration state of the communication apparatus on the basis of the start or the times, for example. The power value then determined is then the actual value 29' of the calibration signal at the tapping point 28. This actual value 29' can then also be compared again with the reference value 32 in the described manner, that is to say the discrepancy can be determined. The variable gain, that is to say the transmission gain value 11 and the reception gain value 12, can then likewise be adapted to the effect that the subsequently captured power values 29 result, for example, for the calibration signal of the reference power, for example +23 dBm.

A third solution provides for the control device 13 to respectively capture the power value 29 for a plurality of transmission signals 5 emitted in succession. In other words, transmission packets are observed over a predetermined period. The cable attenuation can then be heuristically determined using the maximum power and the minimum power observed at the tapping point 28, that is to say the maximum power value and/or the minimum power value 29. For example, provision may be made for the transceiver device 3 to set the signal power of the transmission signals 5 at the transmission output 21 in a predetermined power range, for example from +23 dBm to a minimum signal power of −7 dBm. Discretization which can provide, for example, power levels of the magnitude 0.5 dB can also be provided in this case. In other words, the magnitude of the power level is less than the expected maximum cable attenuation.

Observing the transmission packets in a learning phase, that is to say determining a plurality of power values 29, makes it possible to infer the maximum and/or minimum power of the transmission signals 5 at the tapping point 28. In other words, the discrepancy 33 then corresponds to the discrepancy between the maximum transmission power, on the one hand, and the maximum power value 29, on the other hand. It is similarly possible to calculate a discrepancy 33 between the minimum transmission power and the minimum power value 29. The maximum power and the minimum power then each constitute a reference value 32. Both a maximum power value and a minimum power value can also be provided for the purpose of determining the transmission gain value 11 and the reception gain value 12. Two reference values 32 are then provided.

After the learning phase, that is to say after the transmission gain value 11 and the reception gain value 12 have been set for the first time, the variable gain must be adapted only within the scope of temperature fluctuations, for example, which are very slow. This can be achieved via the discretization, that is to say on the basis of the solution described first for example, since the temperature fluctuations cause changes in the attenuation value which are less than the described discretization of 0.5 dB, for example.

It is also possible to combine the three solutions described by means of the control device 13 or to combine a selection from the three solutions. For example, a calibration phase could take place when switching on the communication apparatus 2 and the heuristic solution could then be used. The time of each transmission signal 5 can also be transmitted by the transceiver device 3, for example by means of the described communication signal LF. However, no further data transmission is required. The signal for signaling the transmission phases, that is to say when a transmission signal 5 is generated, may be the switching signal for switching the multiplexers 24, 27, for example.

Overall, the compensation 31 is therefore technically simplified in the communication apparatus 2 while saving hardware components and system complexity. This is achieved by storing a reference value 32 for a transmission power of a transmission signal 5, with which at least one transmission signal 5 is generated by the transceiver device 3 at the transmission output 21, on the compensator side, that is to say in the antenna arrangement 4, in the control device 13. This known signal power therefore forms a reference power. Overall, the example shows a simplified compensator interface for C2C communication.

What is claimed is:

1. A communication system for a motor vehicle, the system comprising:
   a transceiver unit for generating transmission signals at a transmission output of the transceiver unit, wherein at least two of the transmission signals differ in terms of their signal power;
   a cable coupled to the transmission output to transmit the transmission signals to an antenna connected to an antenna end of the cable via a controllable amplifier device amplifying the transmission signals transmitted via the cable;
   a power detector device capturing a respective power value correlated with a power of the transmission signals at a tapping point between the antenna end of the cable and the antenna; and
   a control device controlling the amplifier device on the basis of the captured power values;
   wherein the transceiver device generates at least one of the transmission signals with a predetermined reference power;

a reference value describing the reference power is permanently predefined in the control device; and the control device selects one of the power values as an actual value of the power of the at least one transmission signal generated with the reference power at the tapping point and sets a transmission gain value of the amplifier device on the basis of a discrepancy between the reference value and the actual value.

2. The communication system as claimed in claim 1, wherein:

the transceiver device generates the transmission signals at the transmission output each solely with a transmission power selected from one of at least two predefined power levels;

the reference power corresponds to one of the power levels, and the control device selects, as the actual value, that power value indicating a power between the power level of the reference power and the next lower power level.

3. The communication apparatus as claimed in claim 1, wherein:

the transceiver device generates, as a transmission signal, a calibration signal with the reference power on the basis of a trigger signal; and the control device selects the actual value on the basis of the trigger signal.

4. The communication apparatus as claimed in claim 1, wherein the reference power corresponds to a maximum or a minimum transmission power, and the control device selects a maximum value or a minimum value of the power values as the actual value.

5. The communication apparatus as claimed in claim 1, wherein:

the amplifier device amplifies reception signals received via the antenna on the basis of a reception gain value and then forwards them to the cable; and the control device sets the reception gain value on the basis of the discrepancy.

6. The communication apparatus as claimed in claim 5, wherein:

the amplifier device is connected to the cable via a multiplexer;

the transceiver device changes over the multiplexer between a transmission position and a reception position by means of a switching signal;

the control device distinguishes between power values of the transmission signals and power values of the reception signals on the basis of the switching signal and account only for power values of the transmission signals for the purpose of determining the discrepancy.

7. The communication apparatus as claimed in claim 1, wherein the control device takes into account only power values captured between the antenna end of the cable and the antenna for the purpose of determining the discrepancy.

8. The communication apparatus as claimed in claim 1, wherein the control device is electrically coupled to the transceiver device solely via the cable.

9. The communication apparatus as claimed in claim 1, wherein the power detector device comprises a diode-based envelope demodulator.

10. The communication apparatus as claimed in claim 1, wherein the communication device generates the transmission signals according to a car-to-car communication protocol.

11. A method for compensating for cable attenuation in a communication apparatus, the method comprising:

generating transmission signals with a transceiver unit, wherein at least two of the transmission signals differ in their signal power;

transmitting the transmission signals through a cable coupled to an output of the transceiver unit and to an antenna, wherein a controllable amplifier device is connected between an antenna end of the cable and the antenna;

capturing respective signal power values with a power detector sensing a power of the transmission signals at a tapping point between the antenna end of the cable and the antenna; and controlling the amplifier on the basis of the captured power values;

wherein the transceiver device generates at least one of the transmission signals with a predetermined reference power;

a reference value describing the reference power is permanently predefined; and an actual value is selected from the power values, the actual value corresponding to the power of the at least one transmission signal generated with the reference power at the tapping point; and a transmission gain value of the amplifier device is set on the basis of a discrepancy between the reference value and the actual value.

* * * * *